(12) United States Patent
Lai

(10) Patent No.: US 7,037,815 B2
(45) Date of Patent: May 2, 2006

(54) METHOD FOR FORMING AN ULTRA-SHALLOW JUNCTION IN A SEMICONDUCTOR SUBSTRATE USING A NUCLEAR STOPPING LAYER

(75) Inventor: Yuan-Chang Lai, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/710,241

(22) Filed: Jun. 29, 2004

(65) Prior Publication Data
US 2005/0287778 A1    Dec. 29, 2005

(51) Int. Cl.
*H01L 21/22* (2006.01)
*H01L 21/38* (2006.01)
*H01L 21/425* (2006.01)
*H01L 21/20* (2006.01)
*H01L 21/36* (2006.01)

(52) U.S. Cl. .................. 438/542; 438/514; 438/478

(58) Field of Classification Search ............ 438/542, 438/510, 478, 302, 303, 301, 308, 514, 548, 438/230, 305
See application file for complete search history.

(56) References Cited

U.S. PATENT DOCUMENTS 6,191,012 B1 *  2/2001  Ng et al. .................. 438/510
6,329,704 B1    12/2001 Akatsu et al.
6,387,782 B1 *  5/2002  Akatsu et al. ............ 438/542

* cited by examiner

*Primary Examiner*—Walter L Lindsay, Jr.
(74) *Attorney, Agent, or Firm*—Winston Hsu

(57) ABSTRACT

A method for forming an ultra-shallow junction in a semiconductor substrate is provided. A semiconductor substrate having a top surface is prepared. A dielectric layer is then formed on the top surface. A first ion implantation process is carried out to implant a plurality of heavy ions into the dielectric layer at a first ion range Rp. Thereafter, a second ion implantation process is carried out to implant a plurality of less-heavy ions into the dielectric layer at a second ion range Rp. The second ion range Rp is smaller than said first ion range Rp. A portion of the plural less-heavy ions are decelerated by the previously implanted heavy ions and are implanted into the semiconductor substrate, thereby forming a ultra-shallow junction containing the less-heavy ions. Subsequently, the dielectric layer is completely removed.

7 Claims, 4 Drawing Sheets

METHOD FOR FORMING AN ULTRA-SHALLOW JUNCTION IN A SEMICONDUCTOR SUBSTRATE USING A NUCLEAR STOPPING LAYER

BACKGROUND OF INVENTION

1. Field of the Invention

The present invention relates to a method for forming an ultra-shallow junction in a semiconductor substrate, and more particularly, to a method for forming an ultra-shallow junction in a semiconductor substrate using a nuclear stopping layer.

2. Description of the Prior Art

Shallow junction or ultra-shallow junction formation might be one of the most important issues in MOSFET scaling. As known in the art, in order to suppress short channel effect, the junction depth of source and drain (S/D) extensions should be reduced as gate length becomes shorter. According to the prediction of SIA roadmap for ULSI technology, the S/D junction depth for 1.8 micron technology is between 40 nm~60 nm, and is between 20 nm~40 nm for 0.12 micron technology. However, as device sizes are scaled down more rigorously, the conventional methods for the fabrication such as ion implantation and rapid thermal annealing show the limits in satisfying the requirements of the SIA roadmap.

Various antimony (Sb) implantation methods have been investigated and have been applied to the fabrication of sub 0.1-micron gate MOSFET devices having ultra-shallow junction depths, since antimony (Sb) ions are heavier and less diffusive than arsenic (As) ions. U.S. Pat. No. 6,191,012 filed Feb. 20, 2001 by Ng, et al., entitled "Method for forming a shallow junction in a semiconductor device using antimony dimer", teaches an antimony dimer implantation process including steps of ion implanting a molecular antimony dimer ($Sb_2^+$) into a semiconductor substrate. The antimony dimer implantation process creates a shallow doped junction having a high dopant concentration and a shallow junction depth. The antimony dimer ion is extracted from an antimony source material at an extremely low extraction voltage. A shallow doped region having a dopant concentration of about 1.0E17 to at least the solid solubility of antimony in silicon (1.0E20 atoms/cm$^3$) is obtained with a junction depth ranging from about 5 to 80 nanometers.

U.S. Pat. No. 6,329,704 filed Dec. 11, 2001 by Akatsu, et al., entitled "Ultra-shallow junction dopant layer having a peak concentration within a dielectric layer", and U.S. Pat. No. 6,387,782 filed May 14, 2002, which is a division application of U.S. Pat. No. 6,329,704, teach a process for forming an ultra-shallow junction depth, doped region within a silicon substrate. The process includes forming a dielectric film on the substrate, then implanting an ionic dopant species into the structure. The profile of the implanted species includes a population implanted through the dielectric film and into the silicon substrate, and a peak concentration deliberately confined in the dielectric film in close proximity to the interface between the dielectric film and the silicon substrate.

SUMMARY OF INVENTION

It is the primary object of the present invention to provide a method for forming a shallow junction in a semiconductor substrate using a nuclear stopping layer.

It is another object of the present invention to provide a method for forming a MOSFET device having ultra-shallow junction S/D extensions.

According to the claimed invention, a method for forming an ultra-shallow junction in a semiconductor substrate is provided. A semiconductor substrate having a top surface is prepared. A dielectric layer is then formed on the top surface. A first ion implantation process is carried out to implant a plurality of heavy ions into the dielectric layer at a first ion range Rp. Thereafter, a second ion implantation process is carried out to implant a plurality of less-heavy ions into the dielectric layer at a second ion range Rp. The second ion range Rp is smaller than said first ion range Rp. A portion of the plural less-heavy ions are decelerated by the previously implanted heavy ions and are implanted into the semiconductor substrate, thereby forming a ultra-shallow junction containing the less-heavy ions. Subsequently, the dielectric layer is completely removed.

From one aspect of this invention, a method for forming an ultra-shallow junction in a semiconductor substrate is provided. A semiconductor substrate having a top surface is prepared. A dielectric layer is grown on the top surface. A plurality of first ions is doped into the dielectric layer at low implant energy to form a nuclear stopping layer in the dielectric layer. A plurality of second ions different from the first ions is then doped into the dielectric layer. A portion of the second ions traverse the nuclear stopping layer and are therefore decelerated by the first ions. The second ions traversing the nuclear stopping layer are implanted into the semiconductor substrate, thereby forming an ultra-shallow junction containing the second ions. The dielectric layer is then removed.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
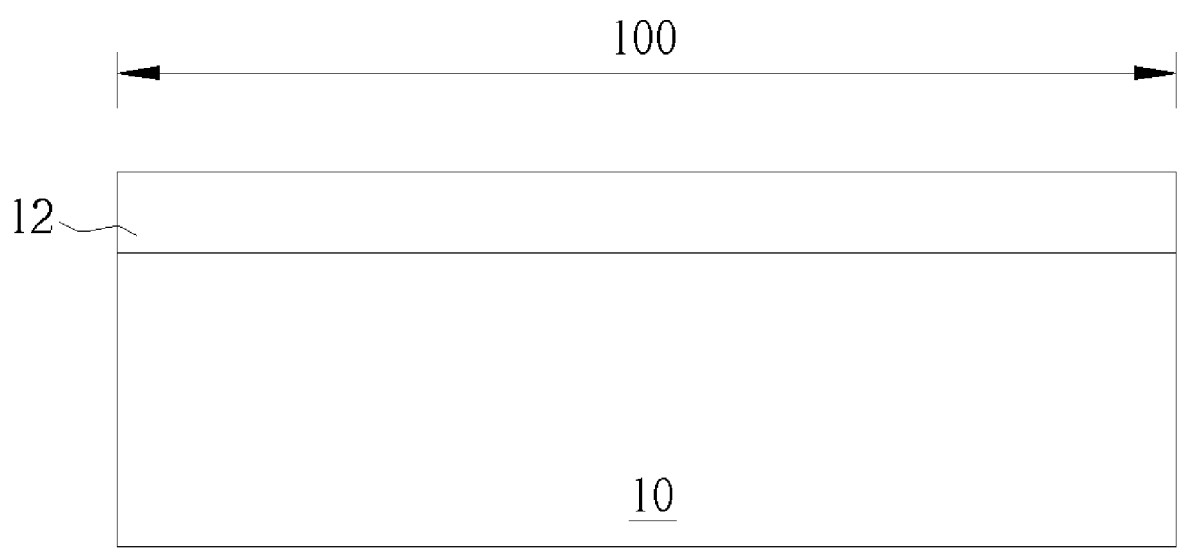
FIG. 1 to FIG. 4 are schematic, cross-sectional diagrams showing a surface portion of a semiconductor substrate where a shallow or ultra-shallow junction is to be formed according to the present invention.

Please refer to FIG. 1 to FIG. 4. FIG. 1 to FIG. 4 are schematic, cross-sectional diagrams showing an enlarged surface portion 100 of a semiconductor substrate 10 where a shallow or ultra-shallow junction is to be formed according to the present invention. As shown in FIG. 1, a semiconductor substrate 10 is provided. A sacrificial dielectric layer 12 such as a silicon dioxide ($SiO_2$) layer is grown on the surface portion 100 of the semiconductor substrate 10. Preferably, the sacrificial dielectric layer 12 is grown by thermal methods known in the art, but other semiconductor methods capable of forming such thin dielectric layer may be used. The sacrificial dielectric layer 12 has a thickness of about 40~500 Å, more preferably, about 80~400 Å, but not limited thereto.

Figure 2:
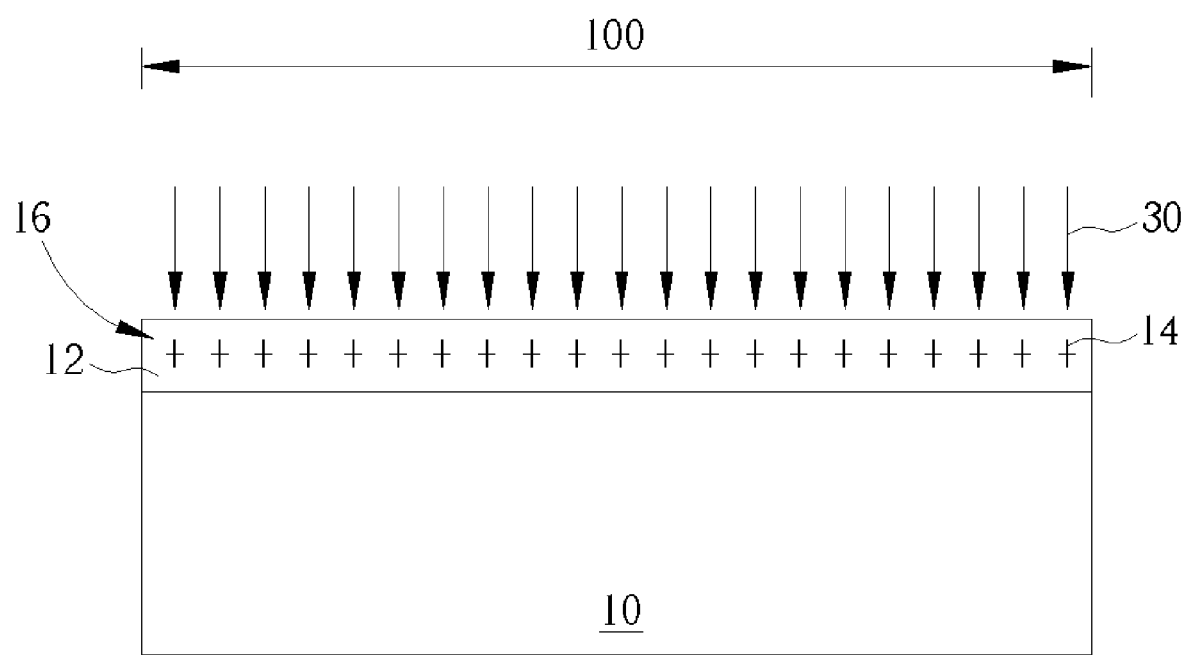

As shown in FIG. 2, a low-energy ion implantation process 30 is carried out. A dose of low-energy heavy ions 14 are implanted into the sacrificial dielectric layer 12 to a preselected first ion range Rp. Preferably, an implant energy ranging from 5~40 keV, preferably 10~30 keV, and a dose 2E15~2E16 atoms/cm$^2$, preferably 1E16 atoms/cm$^2$, are used, but not limited thereto. The peak concentration of the implanted heavy ions 14 is kept in the sacrificial dielectric layer 12. These heavy ions 14, which are mostly distributed in the sacrificial dielectric layer 12 at the depth: first ion range Rp, act as a nuclear stopping layer 16. According to the preferred embodiment of this invention, the heavy ions 14 are antimony ions (Sb$^+$). However, other heavy ions such as ionic antimony dimers (Sb$_2^+$) or arsenic (As$^+$) may be used (in a NMOS case). According to another preferred embodiment of this invention (in a PMOS case), the heavy ions 14 may be In$^+$, BF$_2^+$, B$_{10}$H$_{14}$ or the like. Alternatively, plasma doping or plasma immersion doping methods may be used to substitute the low-energy ion implantation process 30.

Figure 3:
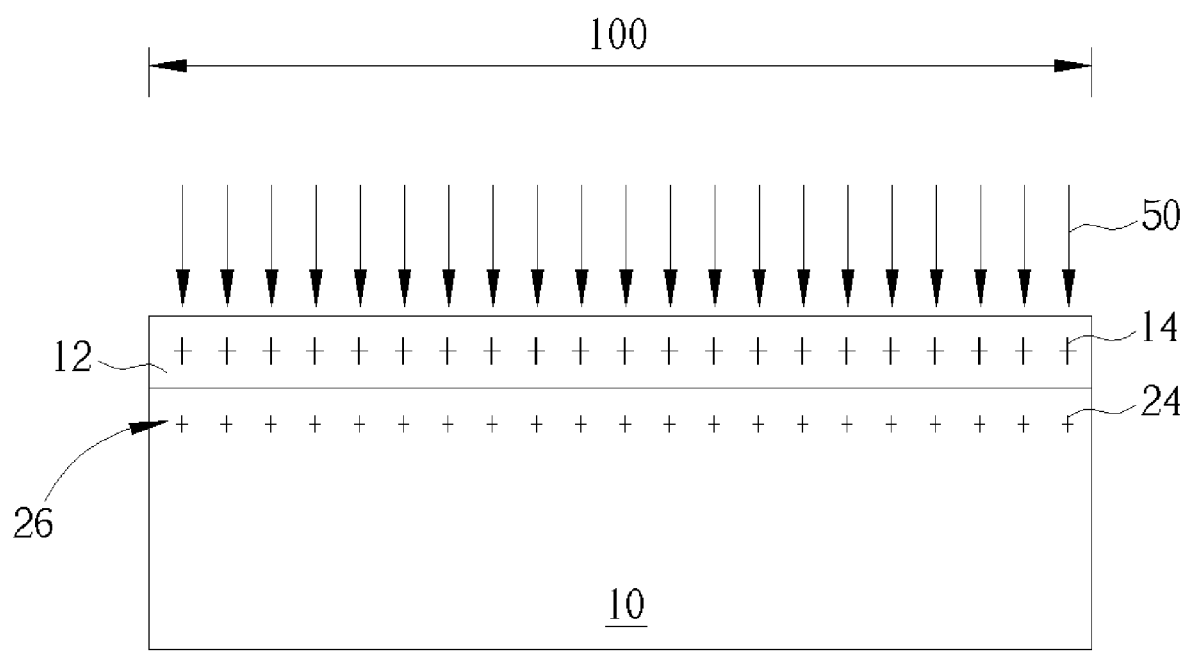

As shown in FIG. 3, after forming the nuclear stopping layer 16, according to the preferred embodiment of the present invention, an ion implantation process 50 is carried out to implant less-heavy ions 24 such as phosphorus ions (P$^+$) into the sacrificial dielectric layer 12. The term "less-heavy" means that the ions 24 have an atomic number that is smaller than the atomic number of the heavy ions 14. In another case, the term "less-heavy" means that the ions 24 have a molecular mass that is smaller than the molecular mass of the heavy ions 14. In still another case, the term "less-heavy" means that the ions 24 (single ions) have an atomic number that is smaller than the molecular mass of the heavy ions 14 (molecular ions). Some of the incident less-heavy ions 24 traverse the nuclear stopping layer 16. The incident less-heavy ions 24 traversing the nuclear stopping layer 16 end up in the surface portion 100 to form an ultra-shallow junction dopant layer 26 having an average junction depth that is less than 50 nm.

The implant energy of the ion implantation process 50 depends upon the first ion range Rp of the previously implanted heavy ions 14. According to the preferred embodiment of this invention, the less-heavy ions 24 are implanted into the sacrificial dielectric layer 12 having a peak concentration lying at a second ion range Rp. It is noteworthy that the second ion range Rp is smaller than the first ion range Rp. In other words, the peak concentration of the implanted less-heavy ions 24 lies closer to the upper surface of the sacrificial dielectric layer 12 than the peak concentration of the implanted heavy ions 14 in the sacrificial dielectric layer 12.

During the implantation, the projectile energy of the implanted less-heavy ions 24 dissipates due to interactions with electrons of the heavy ions 14 and to glancing collisions with the nuclei of the heavy ions 14. A portion of the less-heavy ions 24 traversing the nuclear stopping layer 16 are decelerated by the heavy ions 14 and are therefore injected into the semiconductor substrate 10 at very low implant energy, thereby forming the shallow junction dopant layer 26 containing the less-heavy ions 24. It is believed that the majority of the energy loss is caused by electronic stopping, which behaves roughly like friction between the incident ion species and the electron clouds of the heavy ions 14.

Figure 4:
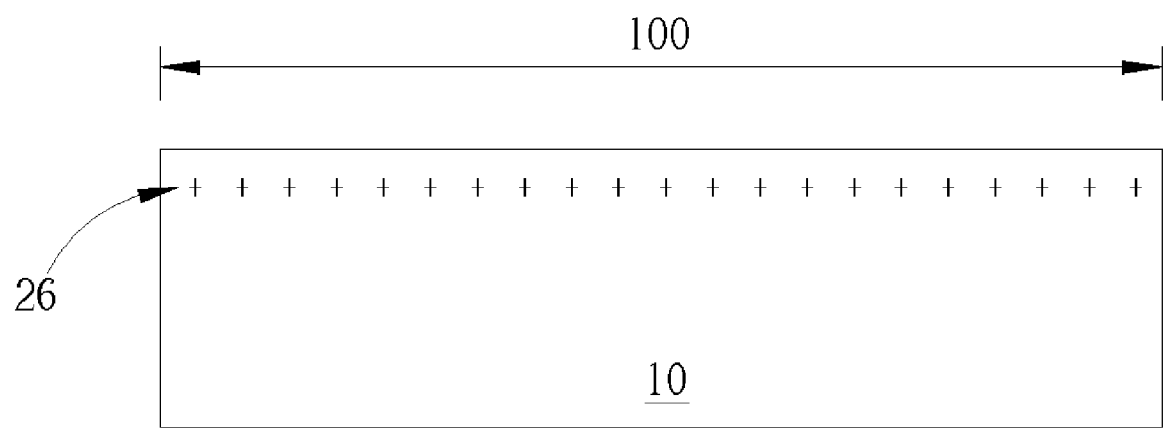

As shown in FIG. 4, subsequently, the sacrificial dielectric layer 12 containing the nuclear stopping layer 16 is etched away. After this, an optional low-thermal budget RTP annealing process may be carried out. It is to be understood that the depicted portion 100 of the semiconductor substrate 10 may be a source/drain (S/D) extension region of a MOSFET device. The gate structure is not shown in figures. Typically, the S/D extension regions are located next to the gate sidewalls or offset spacers formed on the gate sidewalls. In another embodiment, when the shallow junction is P-type junction, the less-heavy ions 24 may be boron ions (B$^+$). By way of example, for a NMOS process, the first implant (low-energy heavy ion implant) may use Sb$^+$ which creates a nuclear stopping layer, the second implant (less-heavy ion implant) may use As$^+$ or P$^+$. If the first implant uses As$^+$, the second implant preferably uses P$^+$. For a PMOS process, the first implant may use In$^+$ which creates a nuclear stopping layer, the second implant (less-heavy ion implant) may use BF$_2^+$ or B$^+$. If the first implant uses BF$_2^+$, the second implant preferably uses B$^+$.

Those skilled in the art will readily observe that numerous modification and alterations of the present invention method may be made while retaining the teachings of the invention. Accordingly, the above disclosure should be construed as limited only by the metes and bounds of the appended claims.

The invention claimed is:

1. A method for forming an ultra-shallow junction in a semiconductor substrate, comprising:
   providing a semiconductor substrate having a top surface;
   forming a dielectric layer on said top surface;
   doping a plurality of heavy ions into said dielectric layer at a first ion range Rp;
   doping a plurality of less-heavy ions into said dielectric layer at a second ion range Rp, wherein said second ion range Rp is smaller than said first ion range Rp, and wherein a portion of said plural less-heavy ions ae decelerated by said heavy ions and are implanted into said semiconductor substrate, thereby forming an ultra-shallow junction containing said less-heavy ions; wherein said doped heavy ions have a first peak concentration lying in said dielectric layer at said first ion range Rp, and said doped less-heavy ions have a second peak concentration lying in said dielectric layer at said second ion range Rp; and
   removing said dielectric layer.

2. The method according to claim 1 wherein said dielectric layer is a silicon dioxide layer.

3. The method according to claim 2 wherein said silicon dioxide layer has a thickness of less than 400 angstroms.

4. The method according to claim 1 wherein said heavy ions are antimony ions (Sb$^+$), and said less-heavy ions are As$^+$ or phosphorus ions (P$^+$).

5. The method according to claim 1 wherein said heavy ions are In$^+$, and said less-heavy ions are BF$_2^+$ or boron ions (B$^+$).

6. The method according to claim 1 wherein said semiconductor substrate is a silicon substrate, and said top surface is an exposed silicon surface.

7. The method according to claim 1 wherein after removing said dielectric layer, the method further comprises the following step:
   annealing said semiconductor substrate.

* * * * *